United States Patent [19]
Chiyoda

[11] Patent Number: 6,081,124
[45] Date of Patent: Jun. 27, 2000

[54] TESTING UNIT FOR CONNECTOR TESTING

[75] Inventor: Kenji Chiyoda, Yokkaichi, Japan

[73] Assignee: Sumitomo Wiring Systems, Ltd., Yokkaichi, Japan

[21] Appl. No.: 09/042,085

[22] Filed: Mar. 13, 1998

[30] Foreign Application Priority Data

Mar. 31, 1997 [JP] Japan ..................................... 9-081515
Oct. 22, 1997 [JP] Japan ..................................... 9-289457

[51] Int. Cl.⁷ .................................................. G01R 31/04
[52] U.S. Cl. ........................... 324/538; 324/756; 324/761; 439/489
[58] Field of Search .................................... 324/538, 754, 324/756, 761; 439/488, 489

[56] References Cited

U.S. PATENT DOCUMENTS

| | | | |
|---|---|---|---|
| 4,658,212 | 4/1987 | Ozawa et al. | 324/754 |
| 5,455,515 | 10/1995 | Saijo et al. | 324/538 |
| 5,512,833 | 4/1996 | Fukuda et al. | 324/538 |
| 5,604,440 | 2/1997 | Tomikawa et al. | 324/538 |
| 5,614,820 | 3/1997 | Aoyama et al. | 324/158.1 |
| 5,712,569 | 1/1998 | Canu et al. | 324/538 |
| 5,859,534 | 1/1999 | Saijo et al. | 324/538 |
| 5,877,622 | 3/1999 | Aoyama et al. | 324/158.1 |

FOREIGN PATENT DOCUMENTS

6-186272   7/1994   Japan .
8-320355  12/1996   Japan .

*Primary Examiner*—Glenn W. Brown
*Attorney, Agent, or Firm*—Greenblum & Bernstein, P.L.C.

[57] ABSTRACT

A testing unit is provided for mounting on a connector testing device for testing a connector which includes a plurality of metal terminals fastened to the connector by a lance system. A probe pin for testing conductivity is held by a molded resin slider having a pair of electrodes. The slider is integrally formed with a probe pin which holds a protrusion for testing, whether the fastening of the lance is complete. Positioning a lance testing member or protrusion relative to the lance can be achieved without providing a rotation-free stopper of the probe pin. In addition, individual failure testing can be achieved compared with the case which holds all of the probe pins. Furthermore, damage to the lance resulting from the material selection can also be avoided. Furthermore, a better connection between a probe pin and a lead wire is also provided when displacing probe pin of a connector testing device relative to the position of a lead wire. This is accomplished by providing a conductive member fixed to a block and connecting a lead wire with the fixed conductive member. Furthermore, the fixed conductive member and a probe pin are relatively and displaceably connected in an electrically conductive manner. The probe pin is retained in a relatively displaceable manner to the block by a slider. Thus, even when the probe pin is displaced relative to the block area during testing, a connecting position of the lead wire is not subjected to displacement from the predetermined position.

13 Claims, 11 Drawing Sheets

TESTING UNIT FOR CONNECTOR TESTING

BACKGROUND OF THE INVENTION

1. Field of the Invention

The present invention relates to a testing unit for a connector testing device.

2. Description of Background Information

In general, a connector used for an electric wiring system such as a wire harness or a sub-assembly (hereinafter totally referred to as a "wire assembly") for forming a wire harness includes a plurality of cavities in a molded resin housing, and metal terminals connected with wires are inserted therein. The metal terminals are fastened within a cavity by a lance system. With this lance system, by fastening a tongue-shape lance formed on either the metal terminal or the connector (mainly on the connector) to a fastening hole formed in the other, removal from the cavity of the terminal metal is prevented.

In the above-mentioned wire assembly production process, conductivity testing of electric wiring condition and connecting condition, etc. of the above-mentioned connectors, as well as testing of the fastening condition of metal terminals and housing are each carried out. There have been proposed various testing areas on a connector testing device capable of carrying out simultaneously testing the conductivity and the fastening condition.

The testing unit of a connector testing device normally includes a connector holder which holds a connector and a testing area capable of moving toward and away from a held connector. The testing area is provided on a block as the main body member, and probe pins are provided on the block and are inserted in a cavity of the connector which is equipped with metal terminals that are electrically connectable to the probe pins. Various improvements are made for the probe pin and block in order to test a fastening condition between the metal terminals and the connector housing.

For example, with the prior art as disclosed in Japanese Unexamined Patent Publication No. HEI 7-113836, the above-mentioned block and probe pin are connected through a spring, structured to be elastically displaceable toward and away from the metal terminals, and provided on the tip of a probe pin with a testing area for incomplete insertion which allows contact with a lance which is incompletely fastened within the cavity. With this prior art, in the event of normal connection of the lance, contact between the probe pin and the metal terminals electrically causes a circuit in the testing unit to close, thus allowing conductive testing. While in case of incomplete fastening of the lance, contact of a partially inserted testing unit with the lance causes the spring to compress, which does not allow the probe pin to reach the metal terminals, thereby resulting in a failure of the conductive test where the fastening condition of the lance is incomplete.

With the prior art as set forth in Japanese Unexamined Patent Publication No. HEI 8-320355, by providing a molded resin slider integrally with a probe pin, and configuring the probe pin to be movable elastically toward and away from the metal terminal, with this slider integrally formed with lance test pins which are similar to those of the above-mentioned incomplete insertion checking unit, incomplete lance fastening was made testable. However, with the above-mentioned slider, all the pins corresponding to the number of poles of metal terminals were integrally held in position.

In the case of the former structure of probe pins, while testing the lance by each metal terminal can be made, damage to the lance may be possible when an incomplete insertion testing area engages a lance which is not completely fastened due to the incomplete insertion testing area being integrally formed with the probe pin. In order that the incomplete insertion testing area can be maintained in a normal position that enables testing of the lance, providing a mechanism for preventing the probe pin from rotation was necessary, which inevitably increased the number of components and also made the structure complicated.

On the other hand, in adopting the latter structure, because all of the lance test pins are integrally formed with the same slider, testing the lance by each metal terminal was difficult. In addition, because all of the lance test pins are integrally formed with the same slider, the load of the spring which biases the slider becomes higher, thereby possibly causing damage to the lance due to greater load applied to the lance when the lance subjected to incomplete fastening engages the lance test pins.

Furthermore, with such a conductive testing device, in order to provide a switching function for testing the condition of a connector (mainly for conditions of the metal terminal or a lance which fastens the metal terminal), there are devices in which the above-mentioned probe pins are mounted on a slider which is displaceable relative to a block area along a direction opposite to a connector holder, with a predetermined force biased in a direction of the connector holder. With this kind of testing device, in making the probe pins contact the terminal pins by moving the block close to the connector holder, the devices are formed in such a manner that the condition of a connector was determined by whether the slider displaces or not.

With the testing device as mounted on a testing unit with a probe pin through a slider which displaces relative to a block area as mentioned above, a lead wire connected with the probe pin also moves in accordance with the displacement of the slider relative to the block area. Therefore, during continued use of the device, the connected area between the lead wire and probe pin is subjected to wear, thereby causing a deficiency that is likely to break the wires.

Thus, the present invention was made to overcome the above-mentioned deficiencies, and therefore an object of the present invention is to provide a testing unit of a connector testing device which can carry out comparatively individual testing of lances and which also avoids damage to the lances which are incompletely fastened.

An additional object of the present invention, in order to overcome the above-mentioned deficiencies, is to provide a testing unit of a connector testing device capable of properly maintaining a connected condition between a probe pin and a lead wire.

SUMMARY OF THE INVENTION

In order to solve the above-mentioned problems, the present invention is a testing unit for a connector testing device provided with a probe pin which tests the electrical conductivity of metal terminals of a connector installed on a connector testing device for testing the connector which has a plurality of metal terminals fastened by a lance method.

A lance testing member capable of testing incomplete fastening of a lance which fastens a metal terminal corresponding to a probe pin is installed in an integrally displaceable manner with the probe pin.

A slider integrally holds the lance testing member and the probe pin, and a block is provided which holds a connector in which the probe pin is held on a connector testing device through the slider.

The above-mentioned slider integrally holds adjacent probe pins having two electrodes in pairs and has an integral lance testing member corresponding to a probe pin.

With the invention including these specific items, because a slider holds the probe pins in pairs for two holes, positioning of a lance testing member on the lance without providing a rotation stop for the probe pin is possible.

Furthermore, because the slider structure holds probe pins in pairs for two holes, far more individual failure testing is possible when compared with the case of all the probe pins being held. In addition, since the lance testing member is integrally formed with a different member from the probe pins, the material of lance testing member can be freely chosen, thus making it possible to avoid damage to the lance resulting from the particular materials.

With the preferred embodiment, the above-mentioned slider and lance testing members are made of molded resin. Furthermore, because the slider and lance testing members are made of molded resin, the material can avoid damage to the lance and can decrease production costs.

Additionally, a testing unit of a connector testing device is also disclosed that is equipped with a probe pin provided on a connector testing device for testing a connector fastened with a plurality of metal terminals, and is connected with a conductive testing device through a lead wire for testing conductivity of the metal terminals of the connector. A slider holds a probe pin and is displaceably held relative to a connector in a block. The testing unit of the connector testing device which carries out testing of a connector by relatively displacing the block and the connector also includes a fixed-side conductive member which is fastened to the block, being electrically and mechanically connected with the lead wire, and a connecting area which relatively and displaceably connect a fixed-side conductive member and the probe pin in an electrically conductive condition.

With the invention containing these elements, even when a probe pin is displaced by having the slider displace relative to the block, the connecting position of the lead wire remains unchanged at a predetermined position. In this case, a "slider which holds a probe pin" may be a slider to which a probe pin is integrally fastened, or may be a slider which displaces integrally with the probe pin in a certain direction and is displaceably connected relative to the probe pin in the opposite direction according to its use.

In another embodiment of the invention, the above-mentioned connecting area contains a biasing member which biases the slider through a probe pin to a connector side. In this case, the above-mentioned biasing member performs as a buffer member which buffers impulse generated when the probe pin bumps against the metal terminals.

BRIEF DESCRIPTION OF THE DRAWINGS

The above and other features and advantages of the present invention will be made apparent from the following description of the preferred embodiments, given as non-limiting examples, with reference to the accompanying drawings, in which.

DESCRIPTION OF THE PREFERRED EMBODIMENTS

With reference to the attached drawings, a detailed description follows of the preferred embodiments of the present invention.

Figure 1:
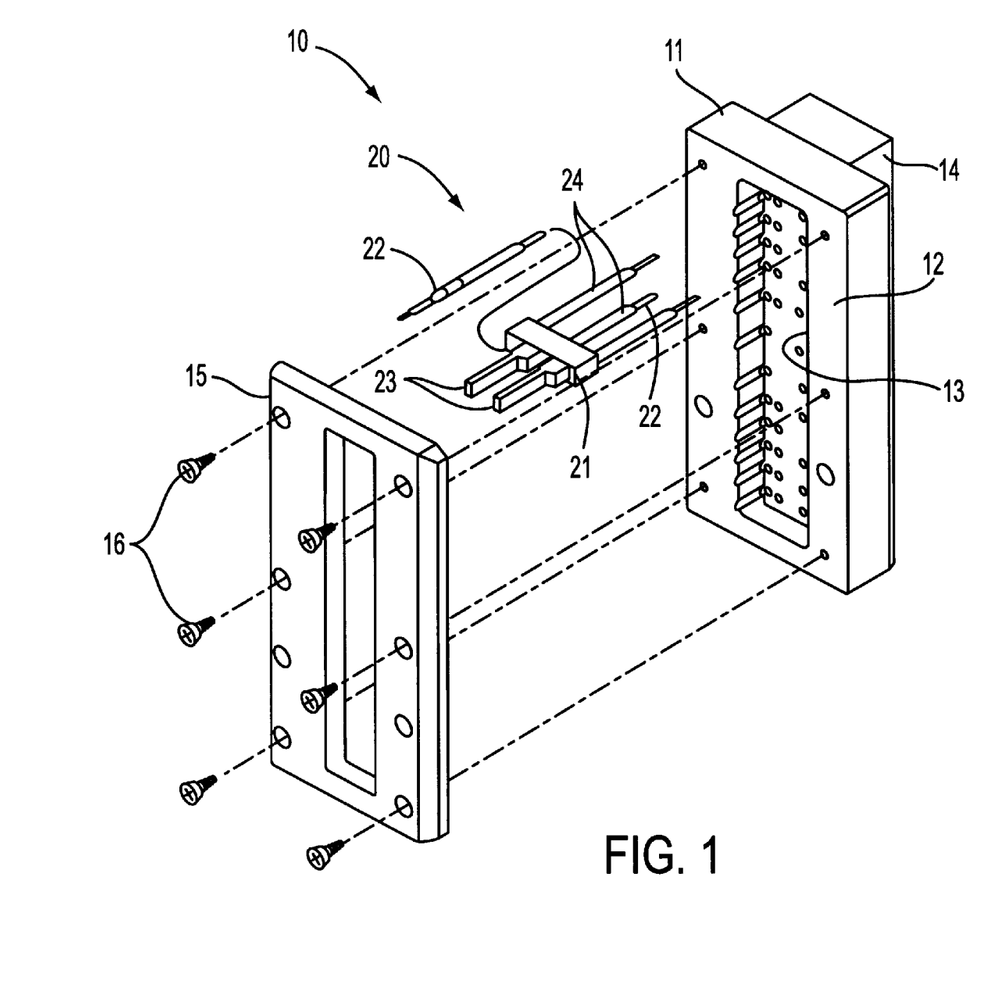
FIG. 1 represents an exploded perspective view of the testing unit of a first embodiment of the present invention.
Figure 2:
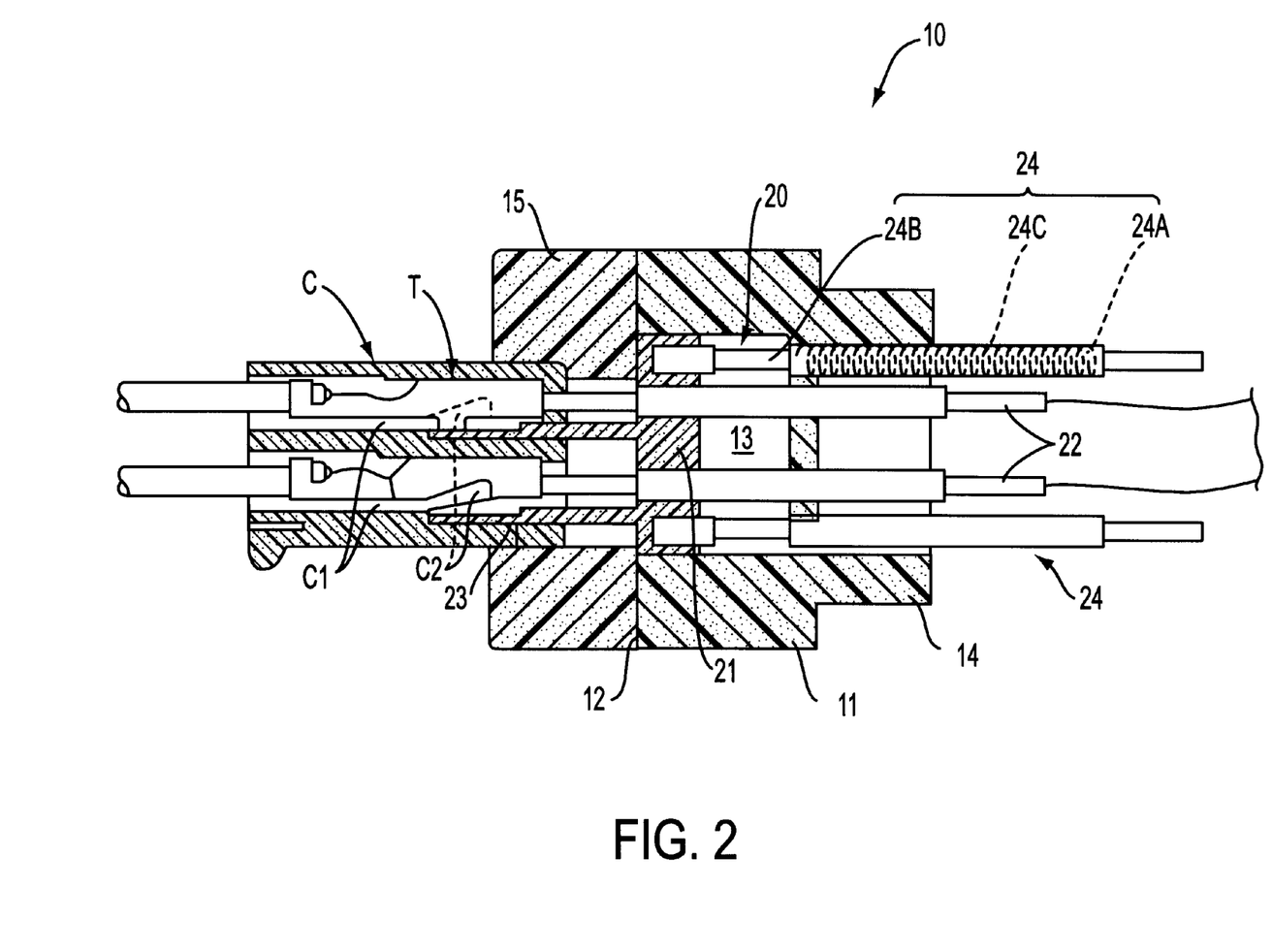
FIG. 2 represents a sectional view showing the function of a testing unit of the embodiment shown in FIG. 1.
Figure 3:
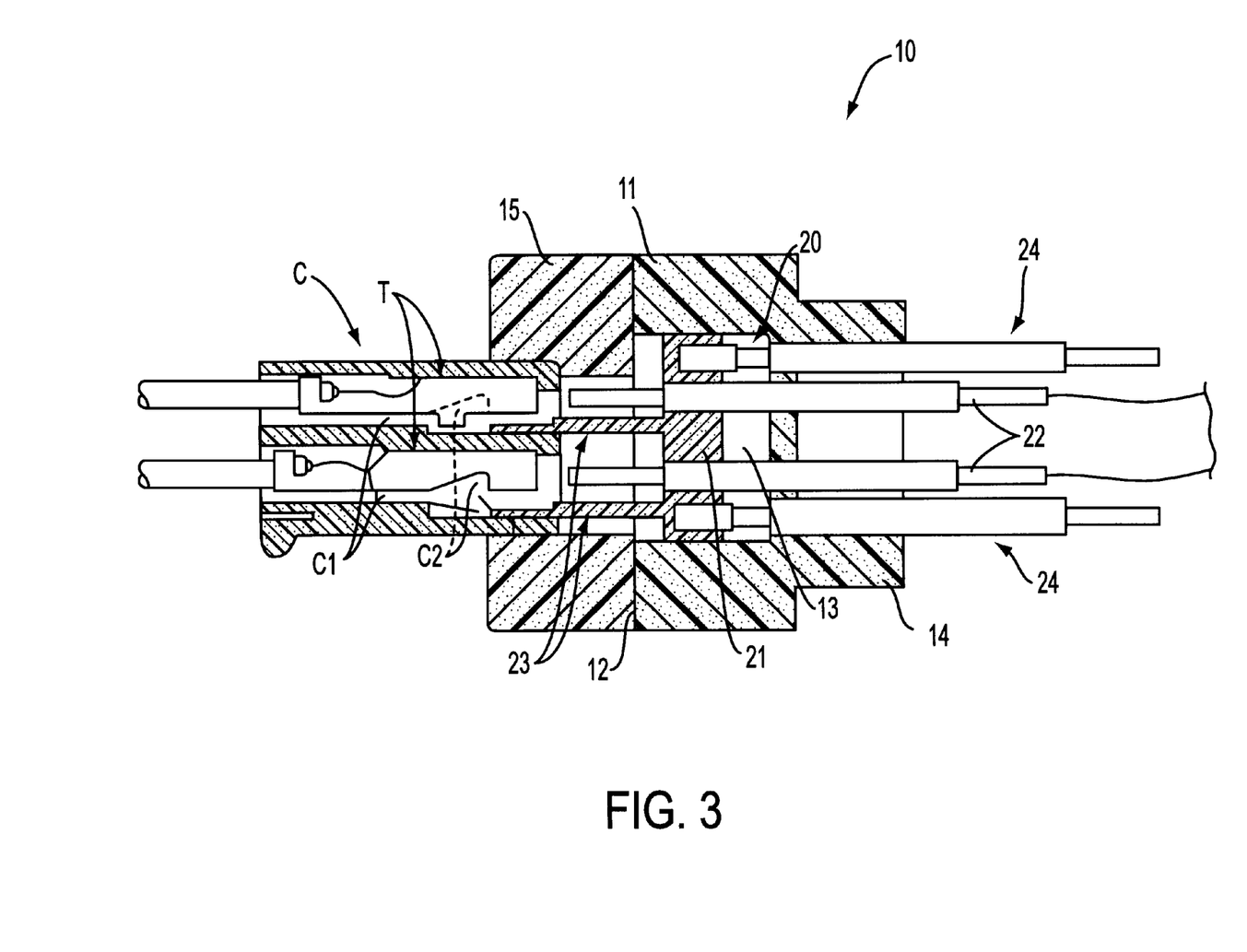
FIG. 3 represents a sectional view showing the function of a testing unit of the embodiment shown in FIG. 1.

FIG. 1 represents an exploded perspective view of a testing unit 10 in a first embodiment of the present invention, and FIGS. 2 and 3 represent sectional views showing the operation of the testing unit of the embodiment shown in FIG. 1.

With reference to these drawings, the embodiment shown comprises a block 11 which extends vertically. The block 11 is made of molded resin formed in a "T" shape as seen in plan, with the front end face 12 (a face as shown in FIG. 1) provided with a recessed rectangular housing 13, and with the rear end face provided with a step 14. The step 14 may be mounted in a lever mechanism of connector testing device (which is not illustrated), which device also includes a structure permitting relative displacement between a testing position which allows the connector C (in FIGS. 2 and 3) held in the connector testing device to be tested and a releasing position for releasing the connector C.

In the recessed housing 13, a plurality of pin units 20 (only one unit is illustrated in the drawing) which represents the key concept of the present invention is incorporated, and is prevented from being withdrawn from the housing 13 by means of a rectangular frame cover member 15 fixed with small screws 16 onto the front end face 12.

As shown clearly in FIG. 2, the pin unit 20 includes a slider 21 which is rectangular in shape and is displaceable in the fore and aft directions within the housing 13, a probe pin 22 which carries out conductive testing for metal terminals of a connector C, and a protrusion 23, which serves as a lance testing member, is provided on the slider 21.

With the embodiments as shown in FIGS. 1–5 of the drawings, a pair of advance/retreat rods 24 are mounted on opposite ends of the slider 21.

The advance/retreat rod 24 is formed from an outer tubular cylinder 24A fastened to the block 11, an inner cylindrical shaft 24B which is displaceable relative to the outer tubular cylinder 24A, and a compression coil spring 24C which is provided within the inner area of the outer tubular cylinder 24A for biasing the inner cylindrical shaft 24B outwardly. With the aid of a pair of the advance/retreat rods 24, the slider 21 is normally elastically biased in a forward direction, i.e., in a direction toward the metal terminals T of the connector C. Although not illustrated in the drawings, a stop (for instance, an outer flange and inner flange), similar to a so-called well-known two probe pin structure, is formed on both members 24A and 24B so that the inner cylindrical shaft 24B will not separate from the outer tubular cylinder 24A.

The above-mentioned slider 21 and the above-mentioned protrusion 23 are integrally formed of molded resin.

The protrusion 23 is provided with an external shape and is dimensioned so that it can contact the lance C2 only when the lance C2 formed on a connector C is incompletely fastened by entering into the cavity C1 for the connector C. With use of this protrusion 23, a structure capable of testing the failure in fastening of lances is accomplished in the same manner as with the prior art.

Also described here with respect to the first embodiment is a slider 21 configured to have a pair of poles formed as two adjacent probe pins 22 and 22, and a pair of protrusions 23 and 23 which correspond to the slider 21 are also integrally formed thereon.

The operation of the first embodiment will now be described with reference to FIGS. 2 and 3 of the drawings.

In reference to FIG. 2, in the event that connector C as a testing subject is normal, a lance C2 is not disposed in the cavity since each lance C2 normally entered into the metal terminals T within the inner area of the connector C. In this situation when the connector C is tested in the testing unit 10 as in the illustrated embodiment, the slider 21 moves to a position connectable with the metal terminals T by the biasing force of compression coil spring 24 on the advance/retreat rod 24 because the protrusion 23 integrally formed with the slider 21 does not engage against the lance C2 and thus enters into the inner area of connector C. Therefore, as the metal terminals T and the probe pins 22 are electrically connected to each other, conductive testing becomes possible and the fastening condition of lance C2 can also be determined to be normal.

On the other hand, as shown in FIG. 3, in the event that either one of the lances C2 is incompletely fastened, because the protrusion 23 comes into contact with the lance C2 which is incompletely fastened during the course of movement of the block 11 and connector C toward each other, the probe pins 22 do not contact the metal terminals T, and the slider 21 is relatively displaced from the block 11 when the block area 11 and the connector C are brought close to a normal testing position, which makes conductive checking impossible. Therefore, a person in charge of testing must test first for abnormality of the lance.

Figure 4:
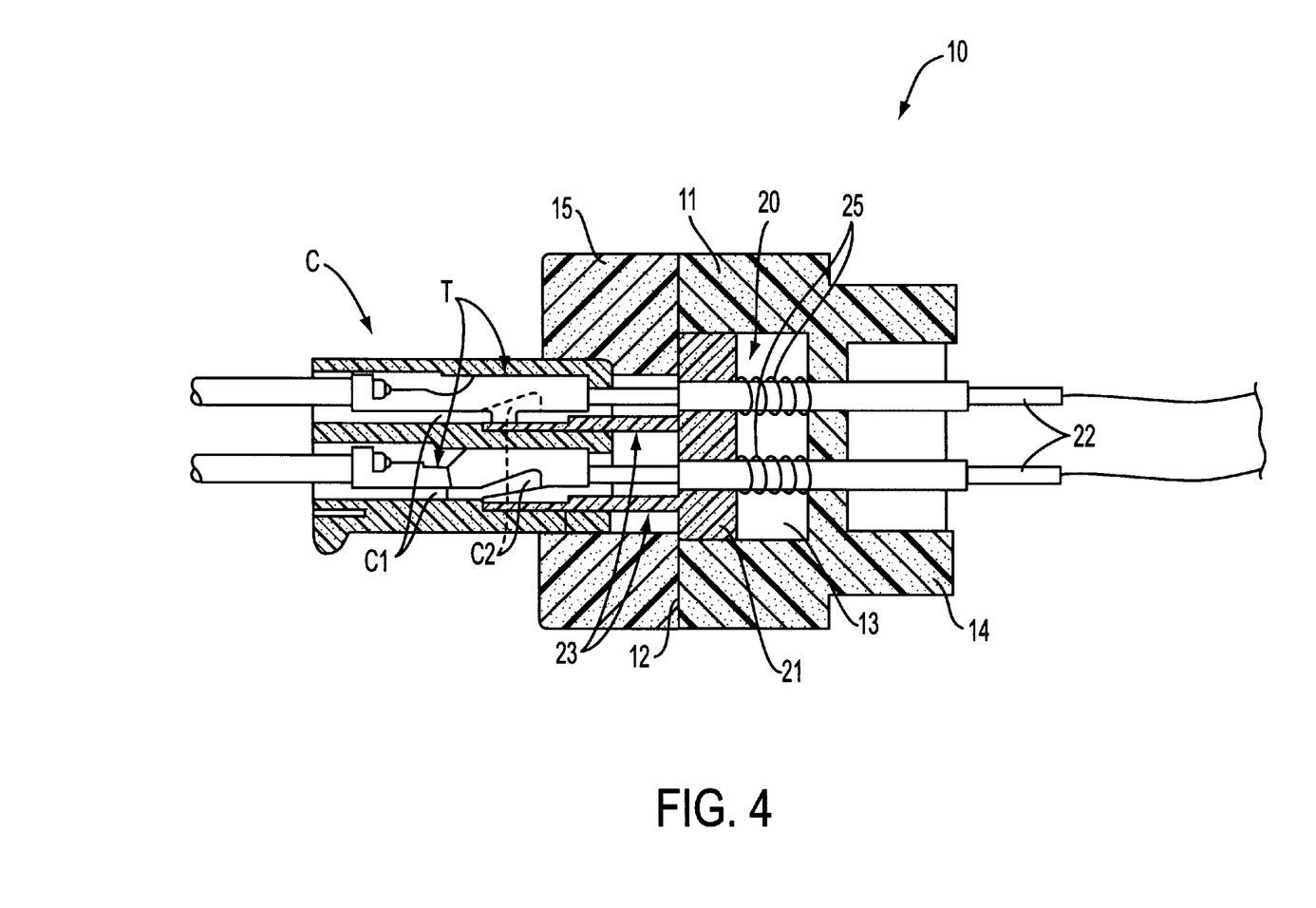
FIG. 4 represents a sectional view showing a second embodiment of the present invention.
Figure 5:
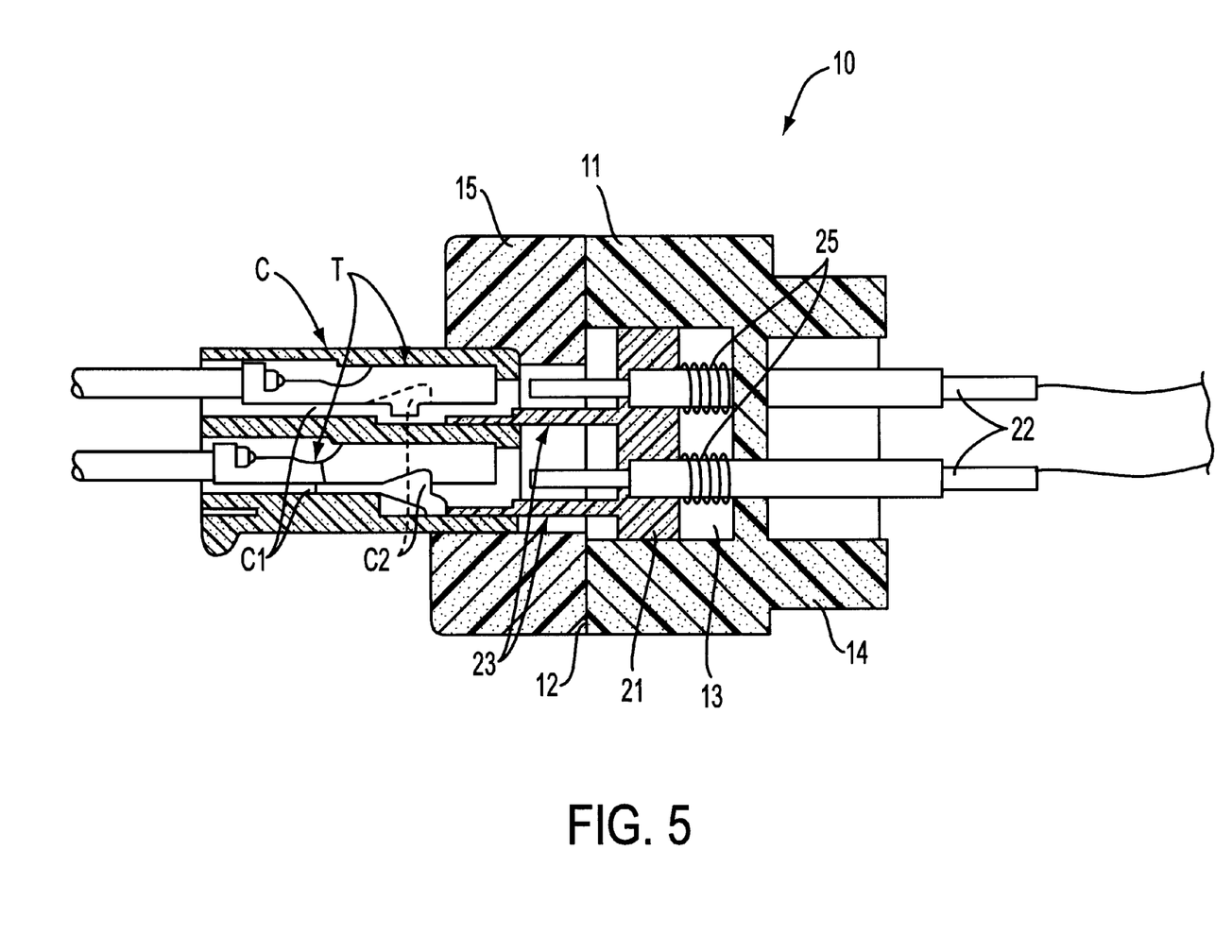
FIG. 5 represents a sectional view showing another view of the second embodiment of the present invention.

FIGS. 4 and 5 represent sectional views of a second embodiment of the present invention.

With these embodiments, in place of the above-mentioned advance/retreat rod 24, a slider 21 is biased in a forward direction by arranging a compression coil spring 25 around the outer peripheral area of each probe pin 22. The coil spring 25 is positioned between the block 11 and the slider 21 as shown in FIGS. 4 and 5.

With this embodiment, the same function as above can be achieved. As explained above, with each of the embodiments described above, because the slider 21 holds the probe pins 22 in a pair of two probes, protrusions 23 can be positioned on the lance C2 without providing a rotation stop or the like for the probe pins 22. In addition, because of the use of a pair of probes on each slider, remarkably individual failure testing is possible when compared with the case of all the probe pins 22 being held. Furthermore, as the protrusion 23 is integrally formed with a slider 21 which is a different member from the probe pins 22, the material (resin in the illustrated embodiment) of protrusion 23 can be selected to avoid damage to the lance (C2. In addition, because the slider 21 and protrusion 23 are formed of molded resin, damage to lance C2 can be avoided and production costs can also be decreased.

Therefore, the above-described embodiment provides superior results compared to individual testing of lance C2, and damage to lance C2 as a result of incomplete fastening can be avoided.

With reference to FIGS. 6–11 of the drawings, further embodiments are shown in which like elements have been designated with the same reference numerals used above. The invention depicted in these figures includes a block 11 which extends vertically. The block 11 is made of molded resin formed in a T-shape as seen in plan, and includes a recessed rectangular housing area 13 on the front-end face 12 (shown in FIG. 6) as well as a step area 14 on the rear-end side provided. The step area 14 may be mounted in a lever mechanism of a connector testing device (which is not shown in the drawing) and which device is also provided with a mechanism which causes a connector C (in FIGS. 7 and 8) to be held on the above-mentioned connector detecting device to displace relatively between a detectable testing position and a releasing position to release the connector C.

In the recessed area of the housing 13, a plurality of pin units 120 (only one unit is shown in the drawing) is incorporated, which are prevented from being detached from the housing area 13 by rectangular-shaped cover member 15 to be fixed to the front-end face 12 by small screws 16.

Figure 7:
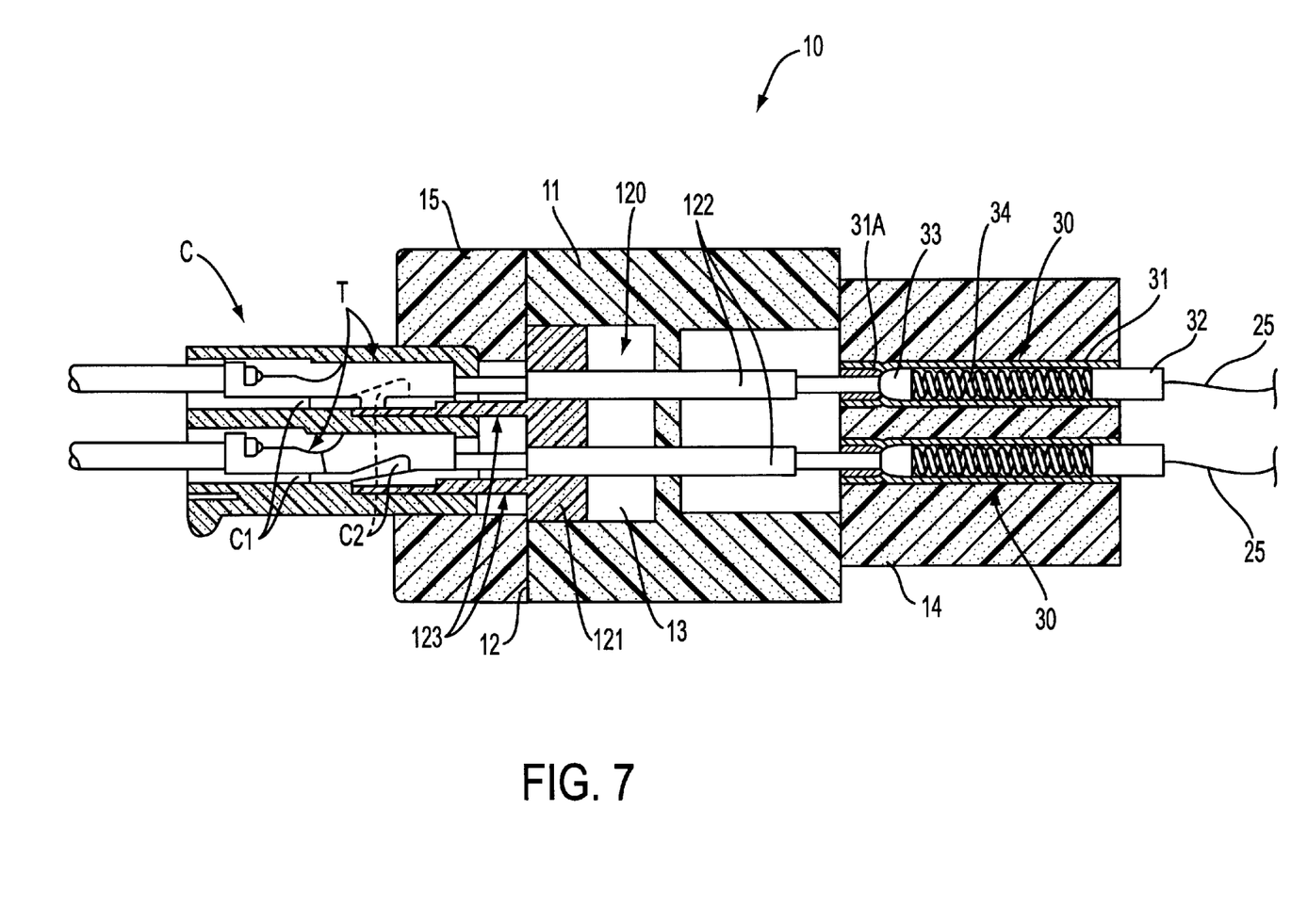
FIG. 7 represents a sectional view showing a function of a testing unit in the embodiment in FIG. 6.

As clearly shown in FIG. 7, the pin unit 120 includes a slider 121 which is formed in a rectangular shape and held within the housing area 13. The slider 121 is displaceable in a fore and aft direction and includes probe pins 122 which carry out conductive testing of metal terminals T of connector C and protrusions 123 which serve as lance testing members.

The slider 121 and the protrusions 123 are integrally formed of molded resin. Each protrusion 123 is configured so that when it enters a cavity C1 of connector C, only when a lance C2 formed on the connector C undergoes a fastening failure, the outer shape and dimension of the protrusion 123 allow contact with the lance C2. With the aid of this protrusion, the structure to test the fastening failure of a lance is made possible as is known.

It should particularly be noted here with regard to this embodiment that each probe pin 122 of pin unit 120 is connected with a lead wire 25 through the connecting pin 30 which is fastened to the block area 11.

Figure 8:
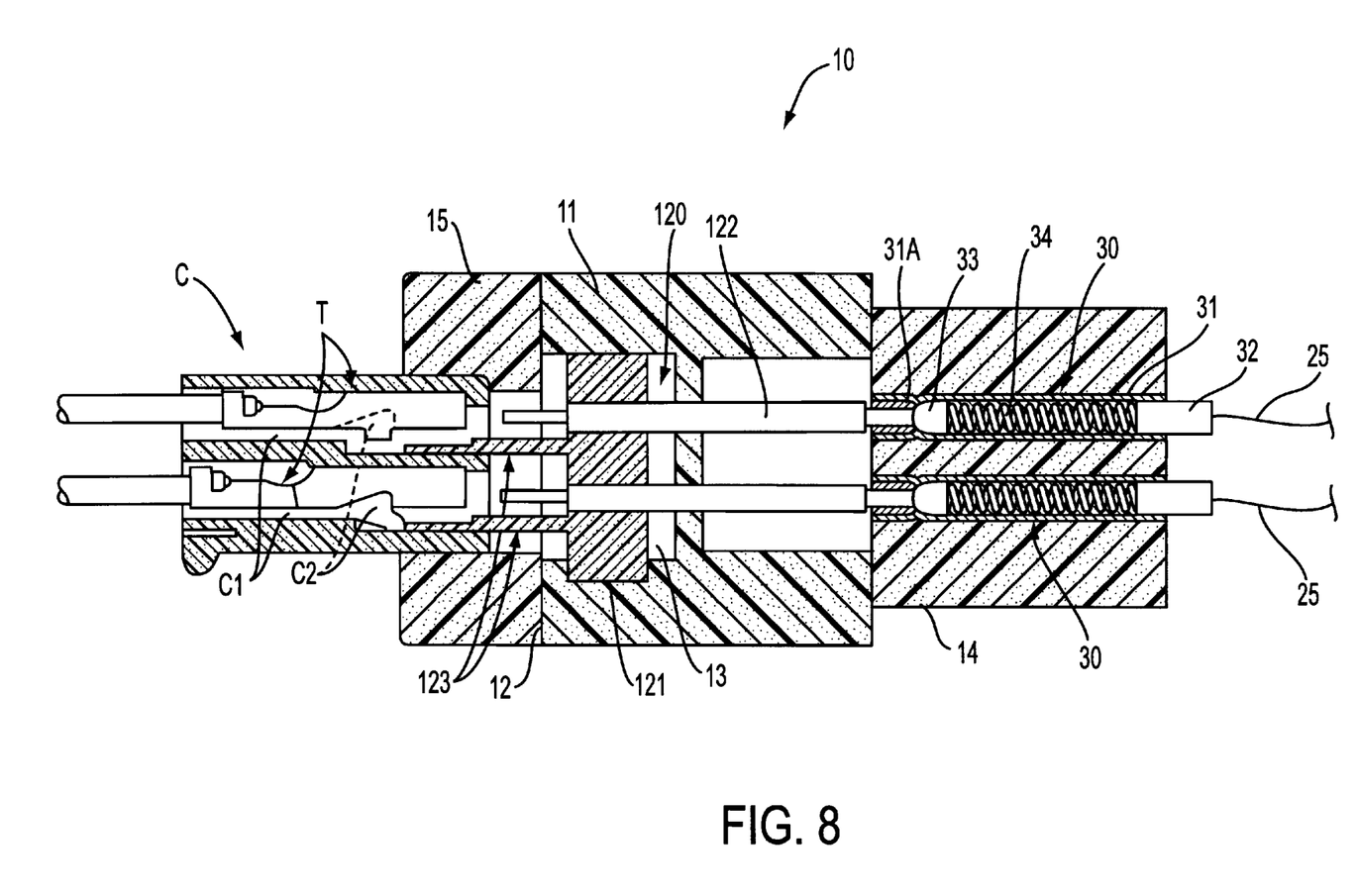
FIG. 8 represents a sectional view showing a function of a testing unit in the embodiment in FIG. 6.

With reference to FIGS. 7 and 8, the connecting pin 30 functions both as a fixed-side conductive member and a connecting area. Connecting pin 30 includes a connecting contact 32 fastened to a tubular member 31 such that a portion protrudes on one end side of the tubular member 31. A slider 33 is slidably mounted within the tubular member 31, and a compression coil spring 34 is provided between the slider 33 and the connecting contact 32.

The tubular member 31 is a metal member fastened to the back of the block 11 in a direction opposite to the connector C, the rear end of which is positioned flush with the rear end of step 14 of block 11.

The connecting contact 32 is a metal member fixed to the back of tubular member 31 by spot welding, etc. A portion of connecting contact 32 protrudes rearwardly to form a connecting area for a lead wire 25. By soldering a lead wire 25 to connecting contact 32, the connecting contact 32 is electrically connected with a probe pin 122 through tubular member 31 as will be disclosed below.

Figure 6:
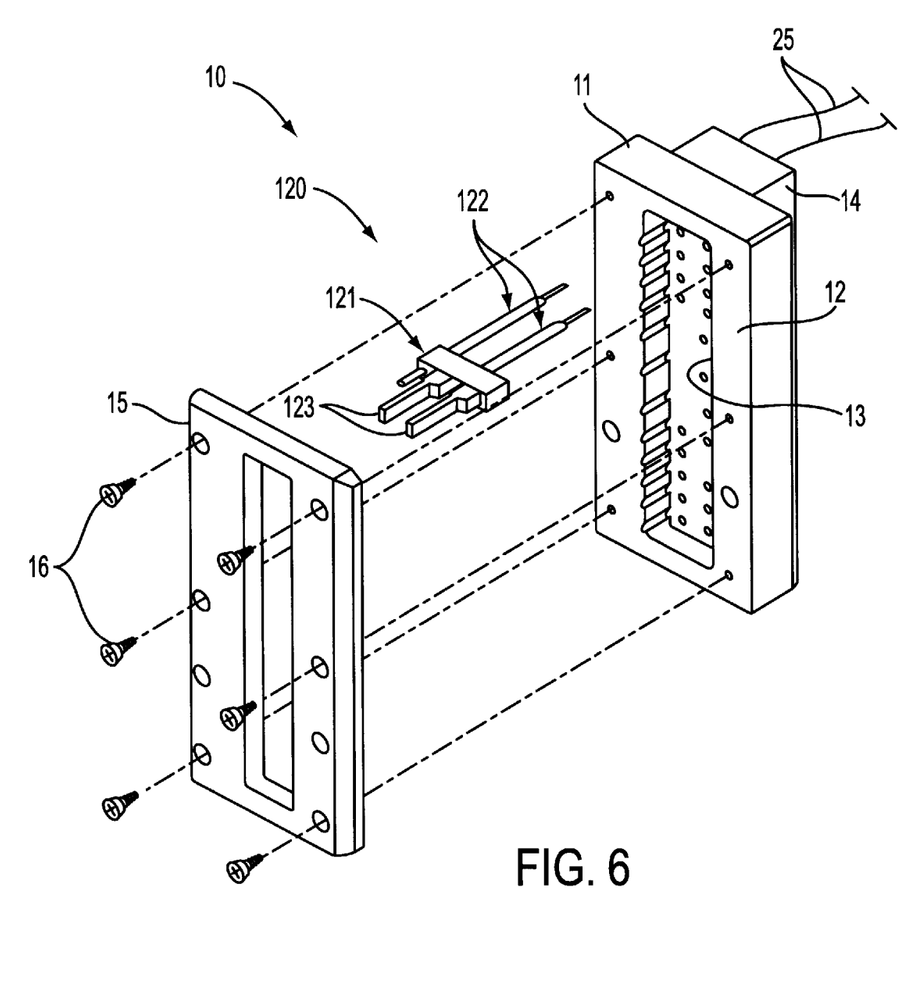
FIG. 6 represents an exploded perspective view of a testing unit in a third embodiment of the present invention.

The slider 33 is formed of a metallic cylindrical member and the tip-side (the side opposite to the connector) is chamfered to have a hemispherical form. The compression coil spring 34 provides a predetermined biasing force to the slider 33. Thus, compression coil spring 34 biases the slider 33 to maintain contact with a probe pin 122 as will be described later. With the embodiment as illustrated in FIGS. 6–8 of the drawings, a reduced diameter area 31A is provided in the peripheral wall of tubular member 31 near the tip area thereof to retain the slider 33 within the tubular member 31.

As shown in FIG. 7, by mounting the slider 121 to a block 11, the back end area of probe pin 122 contacts the slider 33, and the slider 121 is pressed against the side of cover member 15 in a free condition by the biasing force of the compression coil spring 34. The dimensions of slider 121, probe pin 30, etc. are determined so that the slider 121 can be displaced rearwardly against the biasing force of the compression coil spring 34.

The operation of the above-described embodiment with regard to FIGS. 7 and 8 will now be described.

With reference to FIG. 7, when a connector C to be the subject of testing is normal, a lance C2 does not protrude into a cavity as a result of each lance C2 being inserted into a metal terminal T which is incorporated therein. Under this condition, when the connector C is tested with the testing unit 10 of the embodiment illustrated in the drawing, the slider 121 extends to a position to contact the metal terminal T by the biasing force of compression coil spring 34 of the connecting pin 30 because a protrusion 123 which is integrally formed with slider 121 enters into the inner area of the connector C without engaging the lance C2. With this arrangement, the metal terminal T and probe pin 122 are electrically connected. Furthermore, the fastened condition of the lance C2 is also determined to be normal because of the connection of metal terminal T with a lead wire 25 through the tubular member 31 from the slider 33, thereby making the conductivity testing possible.

On the other hand, as shown in FIG. 8, when either one of lances C2 is incompletely fastened, because a protrusion 123 makes contact with the lance C2 which was incompletely fastened during the course of moving the block 11 and the connector C close to each other during movement to a normal testing position, the slider 121 is displaced relative to the block 11, thereby the probe pin 122 does not make contact with the metal terminal T. Consequently, carrying out the conductive is impossible. Therefore, the person conducting the testing must first test abnormality of the lance, thereby fastening failure of the lance is detected.

In this case, with regard to the lead wire 25, the connecting position (connecting contact 32) of lead wire 25 remains fixed at a predetermined position, even when the slider 121 is displaced, by being connected with the tubular member 31. In this way, with the embodiment illustrated in the drawing, even when the probe pin 122 is displaced relative to the block 11, the above-mentioned connecting position is not subjected to the influence of displacement of the probe pin 122. As a result, the lead wire 25 is fixed at a predetermined position. In this way, it provides the superior result of maintaining a connected condition of the probe pin 122 and the lead wire 25.

The embodiment mentioned above is only representative of a preferred alternative of the present invention, and the present invention is not limited to the above-mentioned embodiment alone.

For example, the probe pin 122 may be the one having a coil spring in itself apart from the compression coil spring 34 of connecting pin 30, or it may have the compression coil spring 34 connected with a buffer function when engaging against the metal terminals T.

Figure 9:
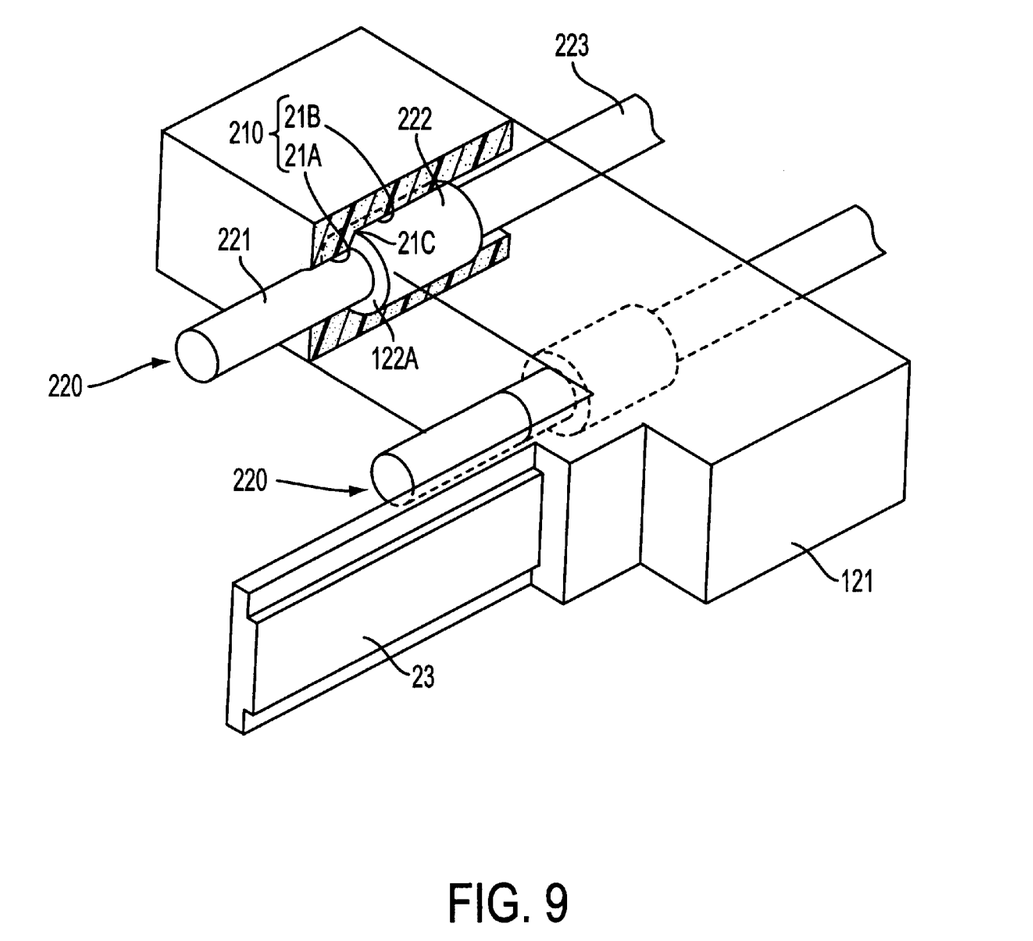
FIG. 9 represents a partially broken-away perspective view showing an essential area of a testing unit in a fourth embodiment of the invention which is a modification of the embodiment shown in FIG. 6.
Figure 10:
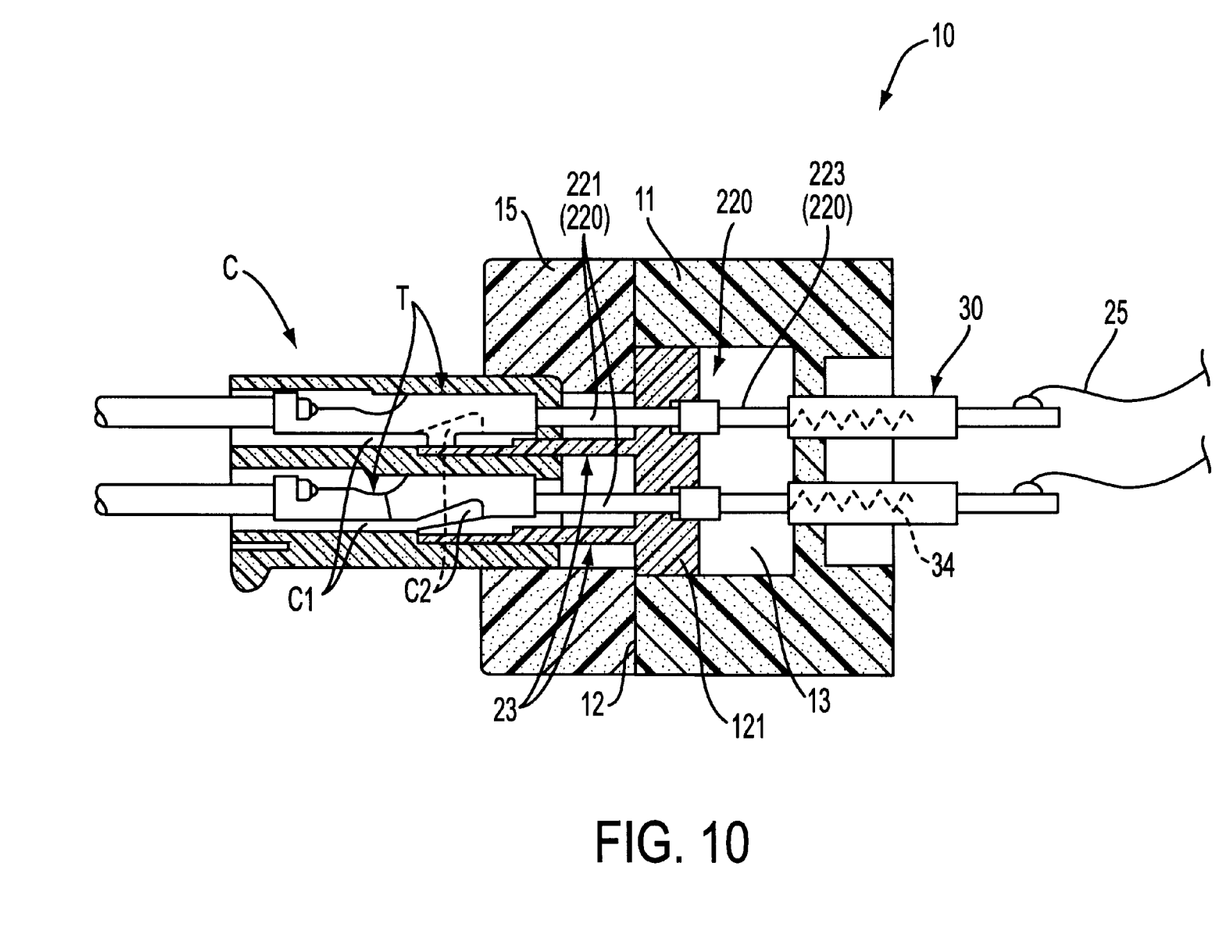
FIG. 10 represents a sectional view showing a function of a testing unit of the embodiment in FIG. 9.
Figure 11:
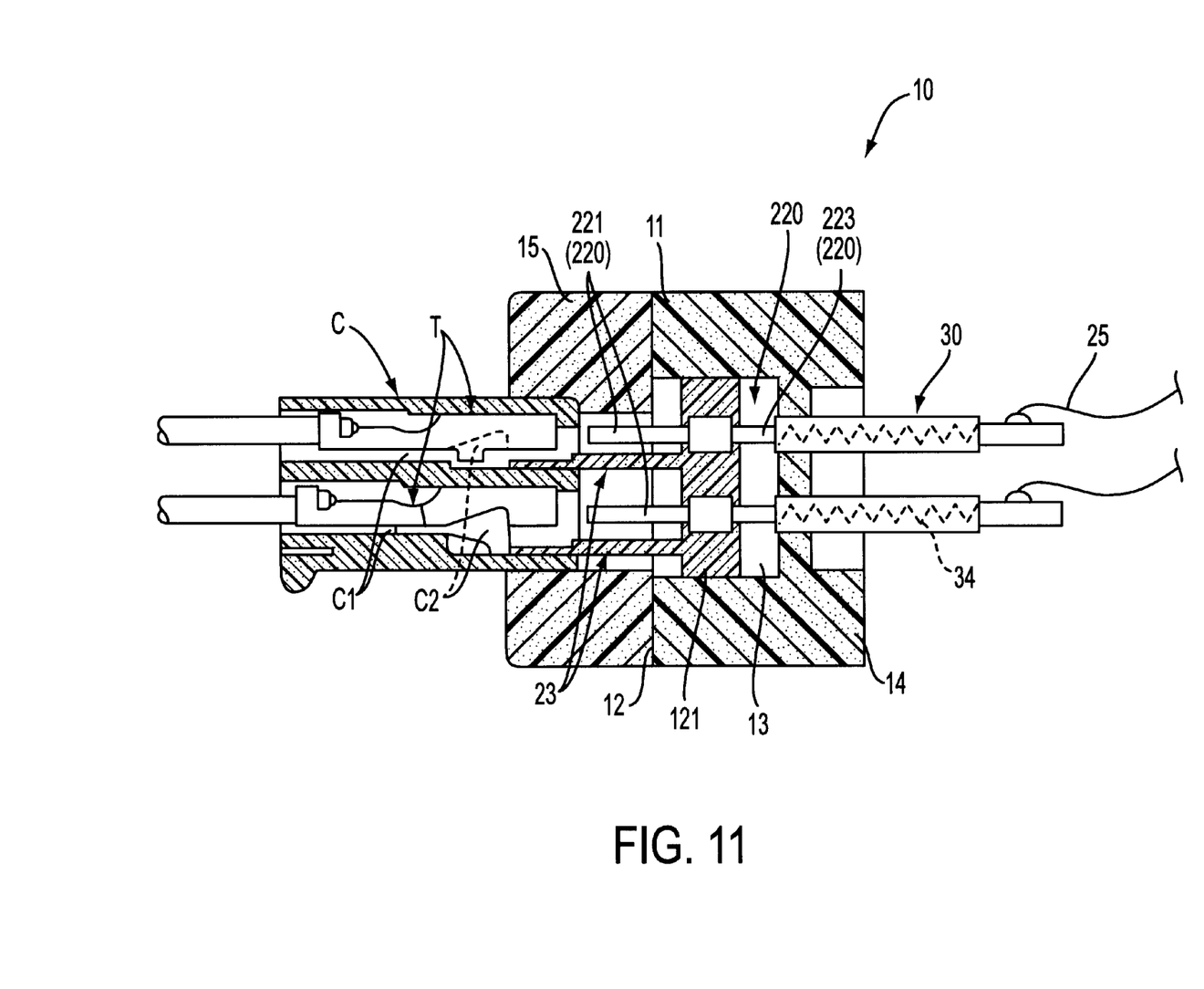
FIG. 11 represents a sectional view showing a function of a testing unit of the embodiment in FIG. 9.

Additionally, a further embodiment of the invention is shown in FIGS. 9–11.

FIG. 9 depicts a partly diagrammatic perspective view showing an essential part testing unit with regard to a fourth embodiment of the present invention. FIGS. 10 and 11 represent sectional views showing testing units of the embodiment as shown in FIG. 9. In this embodiment, the elements corresponding to the same elements in the third embodiment of FIGS. 6–8 as described above-mentioned are provided with the same reference numerals, but with the explanation omitted, in the description which follows below.

Referring to FIGS. 9–11, with reference to the above embodiment as shown in these drawings, a probe pin 220 is similar to the second embodiment of the probe pin which is integrally held by a slider 121.

This probe pin 220 concentrically and integrally includes a contact area 221 which protrudes from a slider 121 toward a connector C side, a larger diameter area 222 formed larger in diameter than the diameter of contact area 221, and a connecting area 223 formed smaller in diameter than that of the larger diameter area 222 and connected with a connecting pin 30.

On the other hand, the slider 121 has an insertion hole 210 having concentric sections including a smaller diameter area 21A which slidably receives the contact area 221 toward the side of connector C, and includes a larger diameter area 21B which slidably receives the larger diameter area 222 toward the opposite side of connector C. This construction makes assembly possible by introducing a contact area 221 and larger diameter area 222 of probe pin 220 from the opening side of larger diameter area 21B of the insertion hole 210. Then, as shown in FIGS. 10 and 11, by connecting the connecting area 223 and connecting pin 30, the compression coil spring 34 of the connecting pin 30 is also used as a buffer member when the probe pin 220 engages against the metal terminal T. When the probe pin 220 is held within the slider 121 in accordance with the above-mentioned structure, because an annular end face 21C provided by a step between the smaller diameter area 21A and the larger diameter area 21B of the slider 121 can engage the end of the larger diameter hole 21B adjacent the smaller diameter hole 21A, both are relatively and displaceably connected. Thus, both displace by being integrally connected when the probe pin 220 displaces to a connector C side or the slider 121 displaces to a connector C side or the slider 121 displaces to an opposite side of the connector C, while both can be relatively displaced in the opposite direction.

With the embodiment as shown in FIGS. 9–11, in the event that connector C to be tested is normal as shown in FIG. 10, the slider 121 extends to a position where probe pins 220 can contact with the metal terminals T by a biasing force of compression coil spring 34 of connecting pin 30 in the same manner as the third embodiment shown in FIGS. 6–8. In this way, as a result of engagement between the metal terminal T and the probe pin 220, the probe pin 220 is electrically connected with the metal terminal T in an elastically displaced condition, to an extent in which its impulse can be buffered, yet it is connected with the lead wire 25 through the connecting pin 30 in the same manner as in the embodiment of FIG. 7.

On the other hand, as shown in FIG. 11, when either one of lances C2 is improperly fastened, a lance contacts protrusion 23 and evidences the failure in fastening during the course of moving the block 11 and connector C toward each other. Thus, carrying out the conductive testing is not possible in the same manner as in the embodiment of FIG. 8, thereby the detection of the lance failure is possible.

Furthermore, with the embodiment as shown in FIGS. 9–11, the lead wire 25 remains fixed at a predetermined position.

In addition, with the embodiment as shown in FIGS. 9–11 of the drawings using the compression coil spring 34 as a buffer member when engaging against the metal terminal T, the number of components of probe pin 220 can be decreased, and the size can be set at a more compact range by making a shorter length in an axial direction. Furthermore, by decreasing the number of components, assembly becomes far easier with higher tolerance of processing accuracy.

Additionally, in holding the probe pin 220 integrally with the slider, when the above-mentioned connecting structure is adopted, there is an advantage that torsion or the like is difficult to generate, because the probe pin 220 can escape individually from the metal terminal T even when the compression coil spring 34 is also used as a buffer member where a plurality of probe pins 220 are held by one slider 121, as shown in the drawing.

In addition, with each of the above-mentioned embodiments, the structure to displace the probe pin 22 (220) relative to the block 11 through the slider 21 (121) may be suitable for the purpose of detecting the improper fastening of lances provided with protrusions for lance testing on the slider 21 (121) as mentioned above, and may also function to check the stop position of metal terminals as was previously proposed in the Patent Application No. HEI 4-338493 (Japanese Unexamined Patent Publication No. HEI 6-186272) by the inventor of the present invention.

In providing a plurality of pin units 20 (220) with a plurality of sliders 21 (121), each slider may hold one pair of probe pins or may hold only one probe pin.

According to the present invention as explained above, a lance testing member can be positioned on a lance without providing a rotation stop of a probe pin, far more individual failure testing can also be achieved when compared with the case of all the probe pins being held, and damage to a lance resulting from material can be avoided. Therefore, according to the present invention, superior results and individual lance testing are possible, and damage to a lance as a result of incomplete fastening can also be avoided.

There may be various design alterations possible within the scope of patent claims of the present invention.

As described above, accuracy of the present invention, even when relatively displacing a probe pin and a block, the above-mentioned connecting position is not subjected to the influence of displacement by the probe pin at all as a result of holding the connecting position of the lead wire at a predetermined position.

In this way, the superior result of maintaining the connecting condition between the probe pin and the lead wire is achieved.

Although the invention has been described herein with reference to particular means, materials and embodiments, the invention is not intended to be limited to the particulars disclosed herein; rather, the invention extends to all functionally equivalent structures, methods and uses, such as are within the scope of the appended claims.

The present disclosure relates to subject matter contained in priority Japanese Application Nos. HEI 9-81515 and HEI 9-289457, filed on Mar. 31, 1997 and Oct. 22, 1997, respectively, which are both herein expressly incorporated by reference in their entireties.

What is claimed:

1. A testing unit for a connector testing device, said testing unit comprising:
    at least one probe pin for testing electric conductivity of a metal terminal of a connector mounted on a connector testing device for testing the connector which includes a plurality of metal terminals each fastened thereto by a lance;
    at least one lance testing member configured to test incomplete fastening of a lance on the connector which normally fastens a metal terminal corresponding to a respective probe pin, said at least one lance testing member being integrally displaceable with a respective probe pin;
    at least one slider including said at least one lance testing member and said at least one probe pin; and
    a block for holding said at least one slider in a relatively displaceable manner to the connector mounted on the connector testing device; and
    said at least one slider integrally holds a pair of adjacent probe pins forming two electrodes in a pair, and said at least one slider is formed unitarily with two of said lance testing members.

2. A testing unit for a connector testing device as set forth in claim 1, wherein said at least one slider and said at least one lance testing member are formed as an integrally molded resin article.

3. A testing unit for a connector testing device as set forth in claim 1, wherein said at least one slider is biased toward the connector.

4. A testing unit for a connector testing device as set forth in claim 1, wherein said at least one slider is biased by a compression spring engaging between said block and said slider.

5. A testing unit for a connector testing device which tests connectors by displacing a block and a connector relative to one another, said testing unit including:
    at least one probe pin provided on the connector testing device for testing a connector to which a plurality of metal terminals are fastened, said at least one probe pin also connected with a conductive testing device through lead wires for testing conductivity of the metal terminals of the connector;
    at least one slider for holding said at least one probe pin; and
    a block for holding said at least one slider in a displaceable manner relative to the connector which is retained in the connector testing device;
    a fixed conducting member fastened to said block and electrically and mechanically connected to one of the lead wires; and
    a connecting member which is relatively displaceable with respect to said fixed conducting member and connects said fixed conducting member with said at least one probe pin in an electrically conductive condition.

6. A testing unit for a connector testing device as set forth in claim 5, wherein said connecting member includes a tubular conductive member fixed to said block, and said fixed conducting member is secured to one end of said connecting member.

7. A testing unit for a connector testing device as set forth in claim 6, wherein said connecting member further includes a slider disposed within said tubular conductive member and biased toward the end opposite said fixed conducting member.

8. A testing unit for a connector testing device as set forth in claim 7, wherein said slider disposed within said tubular conductive member is biased by a compression spring positioned within said tubular conductive member.

9. A testing unit for a connector testing device as set forth in claim 5, wherein said connecting member comprises a biasing member which biases said at least one slider toward a connector side through said at least one probe pin.

10. A testing unit for a connector testing device as set forth in claim 9, wherein said connecting member includes a tubular conductive member fixed to said block, and said fixed conducting member is secured to one end of said connecting member.

11. A testing unit for a connector testing device as set forth in claim 10, wherein said connecting member further includes a slider disposed within said tubular conductive member and biased toward the end opposite said fixed conducting member by said biasing member.

12. A testing unit for a connector testing device as set forth in claim 11, wherein said biasing member comprises a compression spring positioned within said tubular conductive member.

13. A testing unit for a connector testing device as set forth in claim 5, wherein said slider comprises a buffer member which buffers an impulse when said at least one probe pin engages against a metal terminal.

* * * * *